(12) United States Patent
Plihal

(10) Patent No.: US 9,984,454 B2
(45) Date of Patent: May 29, 2018

(54) SYSTEM, METHOD AND COMPUTER PROGRAM PRODUCT FOR CORRECTING A DIFFERENCE IMAGE GENERATED FROM A COMPARISON OF TARGET AND REFERENCE DIES

(71) Applicant: KLA-Tencor Corporation, Milpitas, CA (US)

(72) Inventor: Martin Plihal, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 6 days.

(21) Appl. No.: 15/373,930

(22) Filed: Dec. 9, 2016

(65) Prior Publication Data
US 2017/0309007 A1    Oct. 26, 2017

Related U.S. Application Data

(60) Provisional application No. 62/326,684, filed on Apr. 22, 2016.

(51) Int. Cl.
*G06K 9/00* (2006.01)
*G06T 7/00* (2017.01)
*G06T 7/174* (2017.01)

(52) U.S. Cl.
CPC .............. *G06T 7/001* (2013.01); *G06T 7/174* (2017.01); *G06T 2207/20224* (2013.01); *G06T 2207/30148* (2013.01)

(58) Field of Classification Search
CPC ................... G06T 7/001; G06T 7/174; G06T 2207/20224; G06T 2207/30148
See application file for complete search history.

(56) References Cited

U.S. PATENT DOCUMENTS

| 5,854,674 | A | * | 12/1998 | Lin ......................... G02B 27/46 356/237.1 |
| 5,917,588 | A | * | 6/1999 | Addiego ............. G01N 21/8806 356/237.2 |
| 6,392,749 | B1 | * | 5/2002 | Meeks ................. G01B 11/065 356/634 |
| 6,902,855 | B2 | | 6/2005 | Peterson et al. |

(Continued)

FOREIGN PATENT DOCUMENTS

JP    2005308464 A    11/2005

OTHER PUBLICATIONS

International Search Report and Written Opinion from PCT Application No. PCT/US2017/028985, dated Jul. 12, 2017.

*Primary Examiner* — John Strege
(74) *Attorney, Agent, or Firm* — Zilka-Kotab, PC

(57) ABSTRACT

A system, method, and computer program product are provided for correcting a difference image generated from a comparison of target and reference dies. In use, an intra-die inspection of a target die image is performed to generate, for each pattern of interest, a first representative image. An intra-die inspection of a reference die image is performed to generate, for each of the patterns of interest, a second representative image. Further, the target die image and the reference die image are compared to generate at least one difference image, and the at least one difference image is corrected using each of the generated first representative images and each of the generated second representative images. Detection is then performed using the corrected difference image.

20 Claims, 6 Drawing Sheets

(56) References Cited

U.S. PATENT DOCUMENTS

| | | | |
|---|---|---|---|
| 7,424,146 B2 | 9/2008 | Honda et al. | |
| 8,126,255 B2 | 2/2012 | Bhaskar et al. | |
| 8,204,296 B2* | 6/2012 | Bhaskar | G01N 21/93 382/103 |
| 8,213,704 B2 | 7/2012 | Peterson et al. | |
| 8,559,001 B2* | 10/2013 | Chang | G01N 21/9501 250/559.3 |
| 2004/0170313 A1* | 9/2004 | Nakano | G06T 7/001 382/145 |
| 2005/0232478 A1* | 10/2005 | Onishi | G06T 7/0004 382/149 |
| 2006/0215900 A1* | 9/2006 | Oaki | G06K 9/03 382/145 |
| 2009/0175530 A1* | 7/2009 | Sjostrom | G01N 21/956 382/152 |
| 2010/0021041 A1* | 1/2010 | Matsui | G01N 21/95607 382/141 |
| 2011/0172804 A1* | 7/2011 | Park | G03F 7/70516 700/110 |
| 2011/0286656 A1 | 11/2011 | Kulkarni et al. | |
| 2013/0070078 A1* | 3/2013 | Takagi | G06T 7/001 348/80 |
| 2014/0219544 A1* | 8/2014 | Wu | G06T 7/001 382/149 |
| 2016/0061749 A1* | 3/2016 | Chen | G01N 21/9501 356/237.5 |
| 2016/0321800 A1* | 11/2016 | Thattaisundaram | G06T 7/001 |

\* cited by examiner

SYSTEM, METHOD AND COMPUTER PROGRAM PRODUCT FOR CORRECTING A DIFFERENCE IMAGE GENERATED FROM A COMPARISON OF TARGET AND REFERENCE DIES

RELATED APPLICATION(S)

This application claims the benefit of U.S. Provisional Patent Application No. 62/326,684 filed Apr. 22, 2016, the entire contents of which are incorporated herein by reference.

FIELD OF THE INVENTION

The present invention relates to wafer inspection, and more particularly to detecting defects in wafers.

BACKGROUND

Currently, defects in wafers can be detected by comparing a target die fabricated on the wafer to reference dies fabricated on the wafer. Inspection systems accomplish this by taking images of the target and reference dies for comparison purposes. In particular, detecting the defects often involves performing two separate comparisons to generate two separate results, one comparison being between the target die and one of the reference dies and another comparison being between the target die and the other one of the reference dies. Any similarity between the two separate comparison results is generally used as an indicator of a defect in the target die. This process is known as double difference detection, which can be applied to process window qualification (PWQ) wafers, focus exposure matrix (FEM) wafers, non-modulated wafers, etc.

Prior art FIG. 1 shows traditional layout for a PWQ wafer having a plurality of target dies in a column 102, each being a same pattern modulated (i.e. amplified) by a different combination of parameter (e.g. focus (F) and exposure (E)) values, and further having a plurality of reference dies in columns 104, 106 situated on either side of the column of target dies and each being a nominal (i.e. not modulated) version of the same pattern. Thus, for any particular one of the target dies in column 102, a reference die from column 104 and a reference die from column 106 may be used for detecting defects in the particular target die (see box 108) using double difference detection. While the reference dies are shown as being adjacent to the target die, this is not necessarily always the case. For example, in other wafer configurations the reference dies for any particular target die may be those closest, but not necessarily adjacent, to the particular target component.

In another well-known embodiment (not shown), FEM wafers have a matrix of dies where the parameters of the dies are modulated in a matrix layout. In this embodiment, a center-most die may be nominal, or at least the most nominal of all of the dies on the wafer. Double difference detection may be applied to any target die on the wafer with corresponding reference dies being those adjacent to the target die within the matrix.

Unfortunately, the accuracy of results obtained by these die-to-die comparisons can be negatively affected due to non-critical differences in the target and reference dies. For example, purposeful modulation of target and/or reference dies in process window qualification (PWQ) wafers and focus exposure matrix (FEM) wafers inherently results in these non-critical differences which may be falsely detected as defects during double difference detection. Of course, non-modulated wafers can similarly be affected due to inadvertent but non-critical differences across die images due to error within the inspection system itself.

Prior art FIG. 2 shows an example of the effect of traditional defect detection methods where modulation of only the target component is employed. In FIG. 2, as the modulation is increased for the target component, the size of each part of the target component (including defects and non-defects) also increases, thus causing differentiation between the target and reference components on a part-by-part basis regardless of actual defect. As shown, at higher modulation the difference image resulting from the comparisons includes additional differences than at lower modulations. Existing patents disclosing the above described prior art techniques include U.S. Pat. No. 8,213,704 and U.S. Pat. No. 6,902,855, the descriptions of which are incorporated by the reference in their entirety.

There is thus a need for addressing these and/or other issues associated with the prior art techniques used for defect detection in fabricated components.

SUMMARY

A system, method, and computer program product are provided for correcting a difference image generated from a comparison of target and reference dies. In use, an intra-die inspection of a target die image is performed to generate, for each pattern of interest, a first representative image. An intra-die inspection of a reference die image is performed to generate, for each of the patterns of interest, a second representative image. Further, the target die image and the reference die image are compared to generate at least one difference image, and the at least one difference image is corrected using each of the generated first representative images and each of the generated second representative images. Detection is then performed using the corrected difference image.

DETAILED DESCRIPTION

The following description discloses a system, method, and computer program product for correcting a difference image generated from a comparison of target and reference dies. It should be noted that this system, method, and computer program product, including the various embodiments described below, may be implemented in the context of any inspection system (e.g. wafer inspection, reticle inspection, laser scanning inspection systems, etc.), such as the one described below with reference to FIG. 3B.

Figure 1:
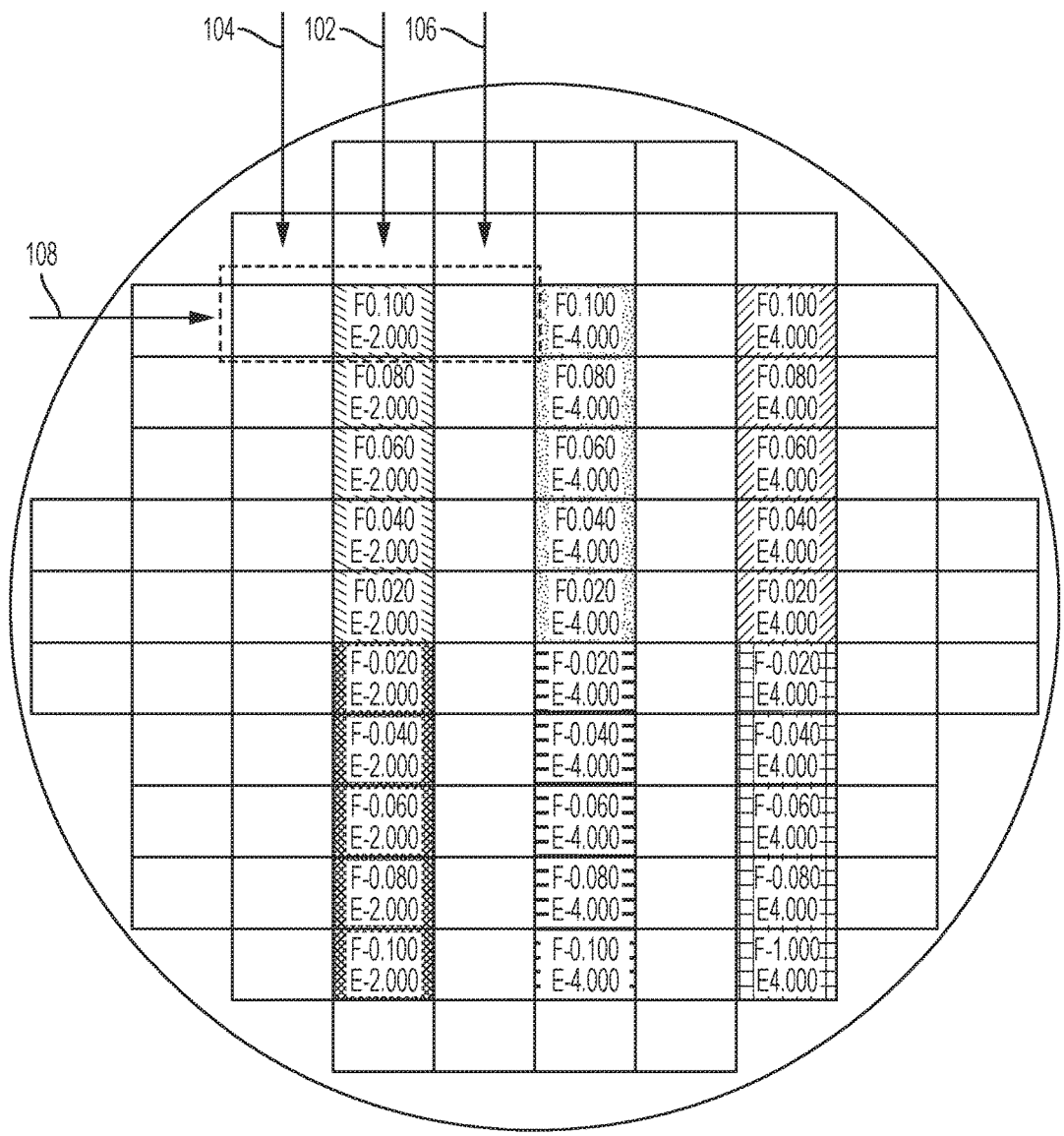
FIG. 1 shows an example layout for a PWQ wafer, in accordance with the prior art.
Figure 2:
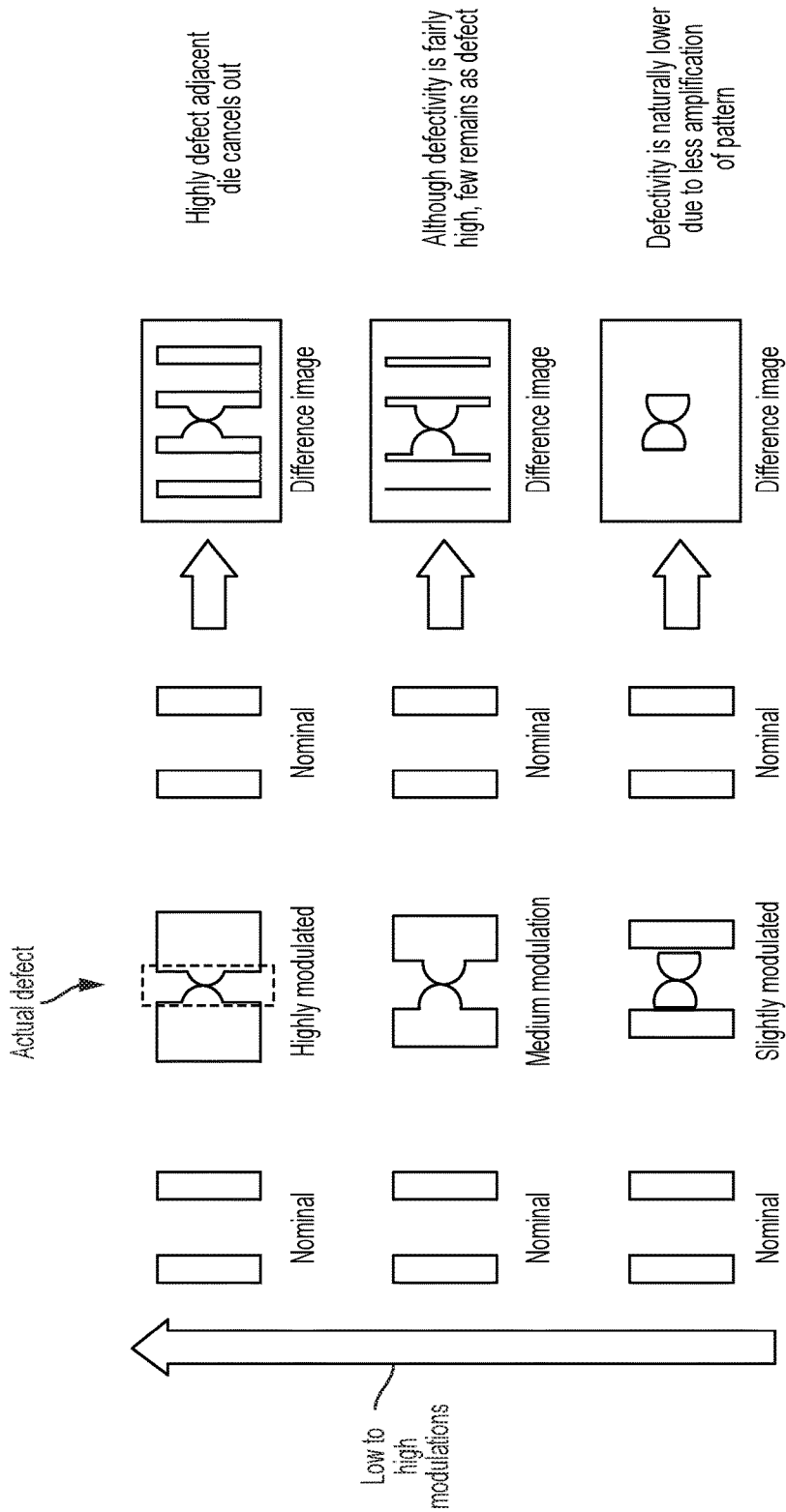
FIG. 2 shows an example of the effect of traditional defect detection methods where modulation of only the target component is employed, in accordance with the prior art.
Figure 3A:
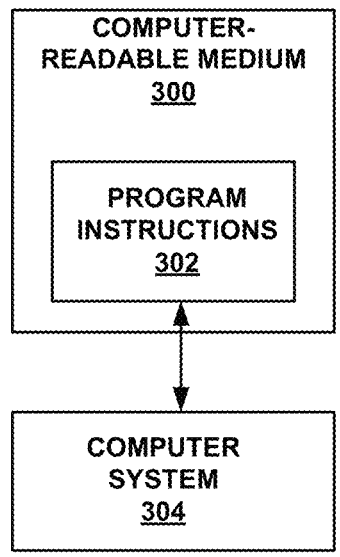
FIG. 3A shows a block diagram illustrating one embodiment of a non-transitory computer-readable medium that includes program instructions executable on a computer system for performing one or more of the computer-implemented methods described herein.

An additional embodiment relates to a non-transitory computer-readable medium storing program instructions executable on a computer system for performing a computer-implemented method for correcting a difference image generated from a comparison of target and reference dies. One such embodiment is shown in FIG. 3A. In particular, as shown in FIG. 3A, computer-readable medium 300 includes program instructions 302 executable on computer system 304. The computer-implemented method includes the steps of the method described below with reference to FIG. 4. The computer-implemented method for which the program instructions are executable may include any other operations described herein.

Program instructions 302 implementing methods such as those described herein may be stored on computer-readable medium 300. The computer-readable medium may be a storage medium such as a magnetic or optical disk, or a magnetic tape or any other suitable non-transitory computer-readable medium known in the art. As an option, computer-readable medium 300 may be located within computer system 304.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

The computer system 304 may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system 304 may also include any suitable processor known in the art such as a parallel processor. In addition, the computer system 304 may include a computer platform with high speed processing and software, either as a standalone or a networked tool.

Figure 3B:
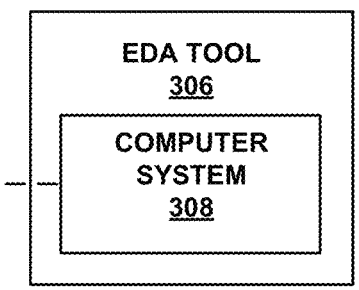
FIG. 3B is a schematic diagram illustrating a side view of one embodiment of an inspection system configured to detect defects on a fabricated device.
Figure 3B:
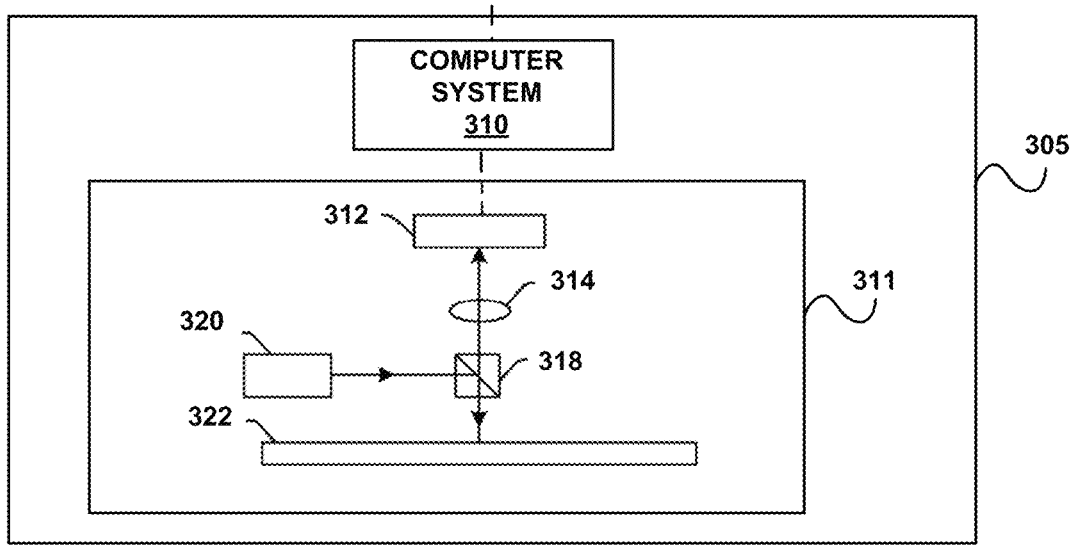

An additional embodiment relates to a system configured to correct a difference image generated from a comparison of target and reference dies. One embodiment of such a system is shown in FIG. 3B. The system includes inspection system 305 configured to generate output for a die fabricated on a wafer (or other device), which is configured in this embodiment as described further herein. The system also includes one or more computer systems configured for performing the operations described below with reference to FIG. 4. The one or more computer systems may be configured to perform these operations according to any of the embodiments described herein. The computer system(s) and the system may be configured to perform any other operations described herein and may be further configured as described herein.

In the embodiment shown in FIG. 3B, one of the computer systems is part of an electronic automation design (EAD) tool, and the inspection system and another of the computer systems are not part of the EAD tool. These computer system may include, for example, the computer system 304 described above with reference to FIG. 3A. For example, as shown in FIG. 3B, one of the computer systems may be computer system 308 included in EAD tool 306. The EAD tool 306 and the computer system 308 included in such a tool may include any commercially available EAD tool.

The inspection system 305 may be configured to generate the output for the die fabricated on a wafer by scanning the wafer with light and detecting light from the wafer during the scanning. For example, as shown in FIG. 3B, the inspection system 305 includes light source 320, which may include any suitable light source known in the art. Light from the light source may be directed to beam splitter 318, which may be configured to direct the light from the light source to wafer 322. The light source 320 may be coupled to any other suitable elements (not shown) such as one or more condensing lenses, collimating lenses, relay lenses, objective lenses, apertures, spectral filters, polarizing components and the like. As shown in FIG. 3B, the light may be directed to the wafer 322 at a normal angle of incidence. However, the light may be directed to the wafer 322 at any suitable angle of incidence including near normal and oblique incidence. In addition, the light or multiple light beams may be directed to the wafer 322 at more than one angle of incidence sequentially or simultaneously. The inspection system 305 may be configured to scan the light over the wafer 322 in any suitable manner.

Light from wafer 322 may be collected and detected by one or more channels of the inspection system 305 during scanning. For example, light reflected from wafer 322 at angles relatively close to normal (i.e., specularly reflected light when the incidence is normal) may pass through beam splitter 318 to lens 314. Lens 314 may include a refractive optical element as shown in FIG. 3B. In addition, lens 314 may include one or more refractive optical elements and/or one or more reflective optical elements. Light collected by lens 314 may be focused to detector 312. Detector 312 may include any suitable detector known in the art such as a charge coupled device (CCD) or another type of imaging detector. Detector 312 is configured to generate output that is responsive to the reflected light collected by lens 314. Therefore, lens 314 and detector 312 form one channel of the inspection system 305. This channel of the inspection system 305 may include any other suitable optical components (not shown) known in the art.

Since the inspection system shown in FIG. 3B is configured to detect light specularly reflected from the wafer 322, the inspection system 305 is configured as a BF inspection system. Such an inspection system 305 may, however, also be configured for other types of wafer inspection. For example, the inspection system shown in FIG. 3B may also include one or more other channels (not shown). The other channel(s) may include any of the optical components described herein such as a lens and a detector, configured as a scattered light channel. The lens and the detector may be further configured as described herein. In this manner, the inspection system 305 may also be configured for DF inspection.

The inspection system 305 may also include a computer system 310 that is configured to perform one or more steps of the methods described herein. For example, the optical elements described above may form optical subsystem 311 of inspection subsystem 305, which may also include computer system 310 that is coupled to the optical subsystem 311. In this manner, output generated by the detector(s) during scanning may be provided to computer system 310. For example, the computer system 310 may be coupled to detector 312 (e.g., by one or more transmission media shown by the dashed line in FIG. 3B, which may include any suitable transmission media known in the art) such that the computer system 310 may receive the output generated by the detector.

The computer system 310 of the inspection system 305 may be configured to perform any operations described herein. For example, computer system 310 may be configured for correcting the target/reference difference image, and optionally further performing the defect detection as described herein. In addition, computer system 310 may be configured to perform any other steps described herein. Furthermore, although some of the operations described herein may be performed by different computer systems, all of the operations of the method may be performed by a single computer system such as that of the inspection system 305 or a stand alone computer system. In addition, the one or more of the computer system(s) may be configured as a virtual inspector such as that described in U.S. Pat. No. 8,126,255 issued on Feb. 28, 2012 to Bhaskar et al., which is incorporated by reference as if fully set forth herein.

The computer system 310 of the inspection system 305 may also be coupled to an other computer system that is not part of the inspection system such as computer system 308, which may be included in another tool such as the EDA tool 306 described above such that computer system 310 can receive output generated by computer system 308, which may include a design generated by that computer system 308. For example, the two computer systems may be effectively coupled by a shared computer-readable storage medium such as a fab database or may be coupled by a transmission medium such as that described above such that information may be transmitted between the two computer systems.

It is noted that FIG. 3B is provided herein to generally illustrate a configuration of an inspection system that may be included in the system embodiments described herein. Obviously, the inspection system configuration described herein may be altered to optimize the performance of the inspection system as is normally performed when designing a commercial inspection system. In addition, the systems described herein may be implemented using an existing inspection system (e.g., by adding functionality described herein to an existing inspection system) such as the 29xx/28xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Figure 4:
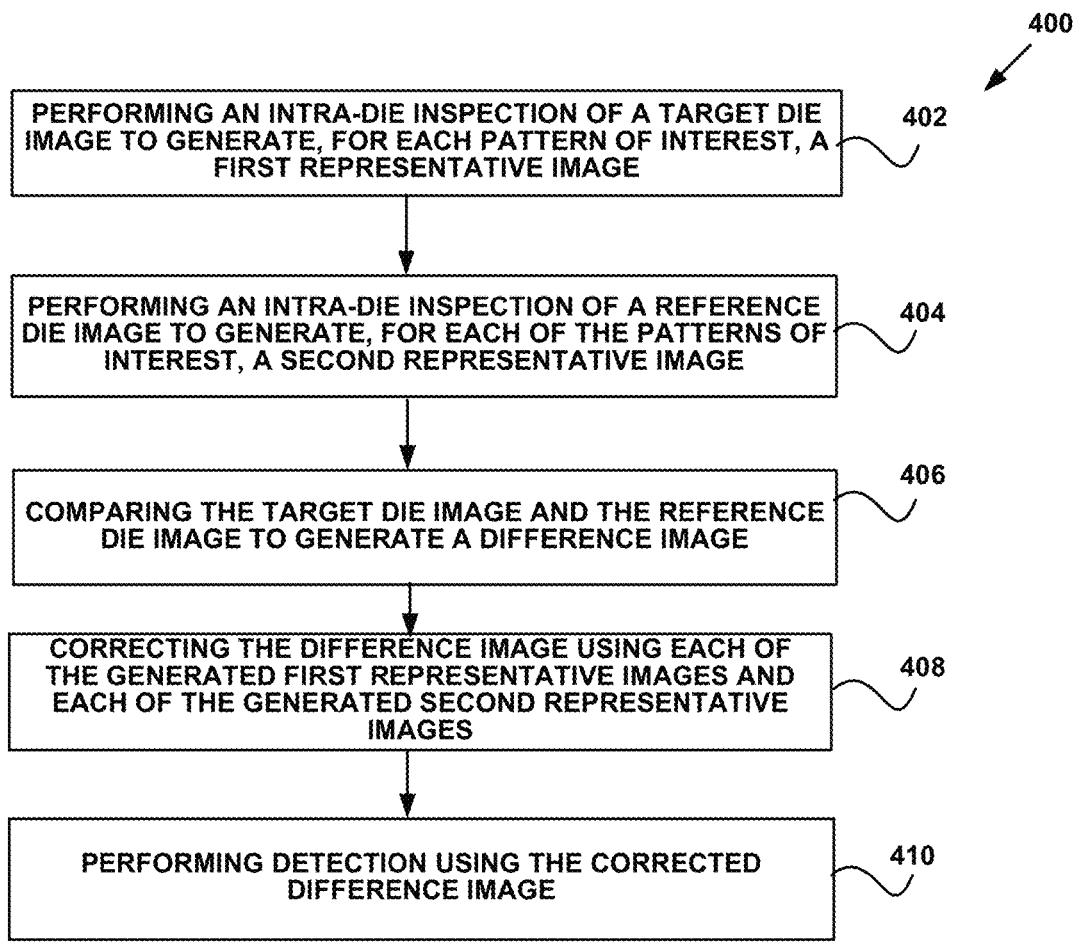
FIG. 4 illustrates a method for correcting a difference image generated from a comparison of target and reference dies, in accordance with an embodiment.

FIG. 4 illustrates a method 400 for correcting a difference image generated from a comparison of target and reference dies, in accordance with an embodiment. The method 400 may be carried out in the context of the environments described above with respect to FIGS. 3A and/or 3B. For example, the method 400 may be carried out by the inspection system 305 of FIG. 3B.

As shown in operation 402, an intra-die inspection of a target die image is performed to generate, for each pattern of interest, a first representative image. The target die image may be any image of a target die fabricated on a wafer. For example, the target die image may be received from a collector of an inspection system.

The wafer on which the target die is fabricated may be a PWQ wafer, FEM wafer, or other modulated wafer such that the target die may be modulated. In another embodiment, the wafer may be a non-modulated wafer such that the target die may not be modulated.

As noted above, the intra-die inspection is performed for one or more patterns of interest. These patterns of interest may be identified from analyzing a design of the wafer to identify patterns therein known to be prone to defects, in one embodiment. In any case, for each of the patterns of interest, the intra-die inspection of the target die image is performed to generate a first representative image for the target die image.

The first representative image may be an aggregate (e.g. pixel-by-pixel mean or pixel-by-pixel median) of signals collected from locations in the target die image having the pattern of interest. For example, the intra-die inspection may involve identifying a pattern of interest within the target die image, identifying all instances of the pattern of interest within the target die image (e.g. across all swaths of the target die image), creating care areas for the instances, grouping the care areas (e.g. into a single group associated with the pattern of interest), collecting a signal from each of the care areas, and aggregating the collected signals, where the aggregated signal is the first representative image for the pattern of interest.

As noted above, the intra-die inspection is performed for each pattern of interest. In this way, a separate first representative image may be generated for each different pattern of interest within the target die image.

As shown in operation 404, an intra-die inspection of a reference die image is performed to generate, for each of the patterns of interest, a second representative image. The reference die image may be any image of a reference die fabricated on the wafer. For example, the reference die image may be received from the collector of the inspection system.

Where the wafer is a PWQ wafer or non-modulated wafer, the reference die may not necessarily be modulated. Where the wafer is a FEM wafer, the reference die may be modulated.

As noted above, the intra-die inspection of the reference die image is performed for each of patterns of interest identified for the target die image. For each of the patterns of interest, the intra-die inspection of the reference die image is performed to generate a second representative image for the reference die image.

The second representative image may be an aggregate (e.g. pixel-by-pixel mean or pixel-by-pixel median) of signals collected from locations in the reference die image having the pattern of interest. For example, the intra-die inspection may involve identifying one of the patterns of interest associated with the target die image, identifying all instances of the pattern of interest within the reference die image (e.g. across all swaths of the reference die image), creating care areas for the instances, grouping the care areas (e.g. into a single group associated with the pattern of interest), collecting a signal from each of the care areas, and aggregating the collected signals, where the aggregated signal is the second representative image for the pattern of interest. This may be repeated for each of the patterns of interest identified for the target die image. In this way, a separate second representative image may be generated for each different pattern of interest within the reference die image.

Further, as shown in operation 406, the target die image and the reference die image are compared to generate at least one difference image. Each difference image may indicate a corresponding location in the target die image and the reference die image having a different signal. In one embodiment, each difference image may be generated without use of a sensitivity threshold (i.e. a difference image may be generated for any level of difference between corresponding locations in the target die image and the reference die image).

The at least one difference image is then corrected using each of the generated first representative images and each of the generated second representative images, as shown in operation 408. As noted above, each difference image corresponds to a particular location in the target die image and the reference die image having a difference. Each difference image may thus be corrected using one of the first representative images and one of the second representative images generated for a pattern of interest at that particular location.

Just by way of example, correcting the difference images may include for each of the patterns of interest, obtaining a representative difference between the first representative image generated for the pattern of interest and the second representative image generated for the pattern of interest, and subtracting the representative difference from the difference image associated with a location having the pattern of interest.

As shown in operation 410, detection is then performed using the corrected difference image. Performing the detection using the at least one corrected difference image may include applying a detection algorithm to the at least one corrected difference image to detect defects in the target die image.

Figure 5:
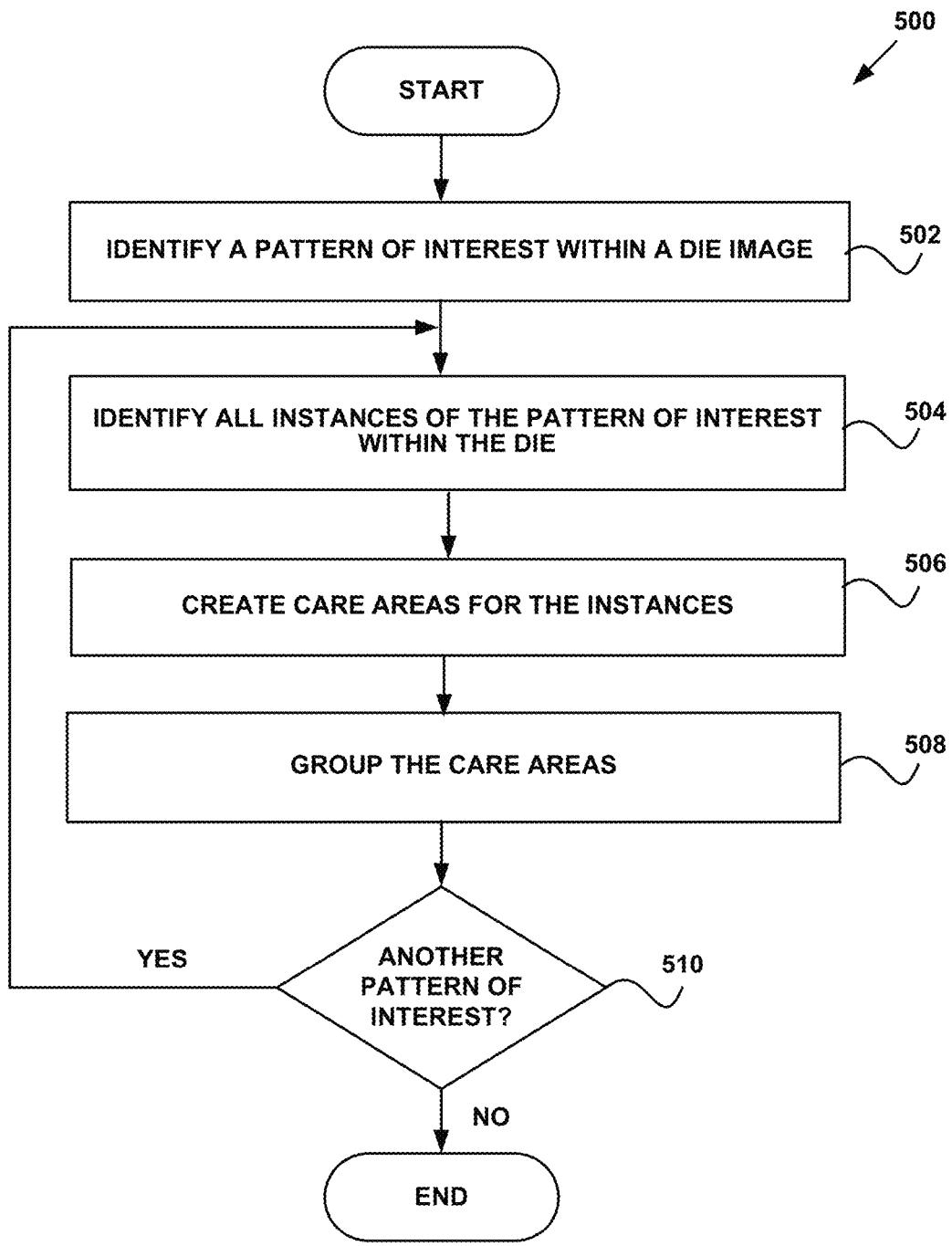
FIG. 5 illustrates a method for generating setup data for use in correcting a difference image generated from a comparison of target and reference dies, in accordance with an embodiment.

FIG. 5 illustrates a method 500 for generating setup data for use in correcting a difference image generated from a comparison of target and reference dies, in accordance with an embodiment. The method 500 may be carried out in the context of the environments described above with respect to FIGS. 3A and/or 3B. For example, the method 500 may be carried out by the inspection system 305 of FIG. 3B. The above description and definitions may also equally apply to the present description.

It should be noted that the method 500 may be repeated for both a target die image and a reference die image collected from a wafer. As shown in operation 502, a pattern of interest within a die image is identified. All instances of the pattern of interest are then identified within the die (e.g. using a pattern search), as shown in operation 504.

Care areas for the instances are then created, as shown in operation 506. The care areas may be the smallest possible areas at the locations having the instances. The care areas are grouped, as shown in operation 508. In other words, the care areas may be grouped by the pattern of interest (e.g. using a larger context), and the method 500 may be repeated for each additional pattern of interest identified within the die image (see decision 510).

Figure 6:
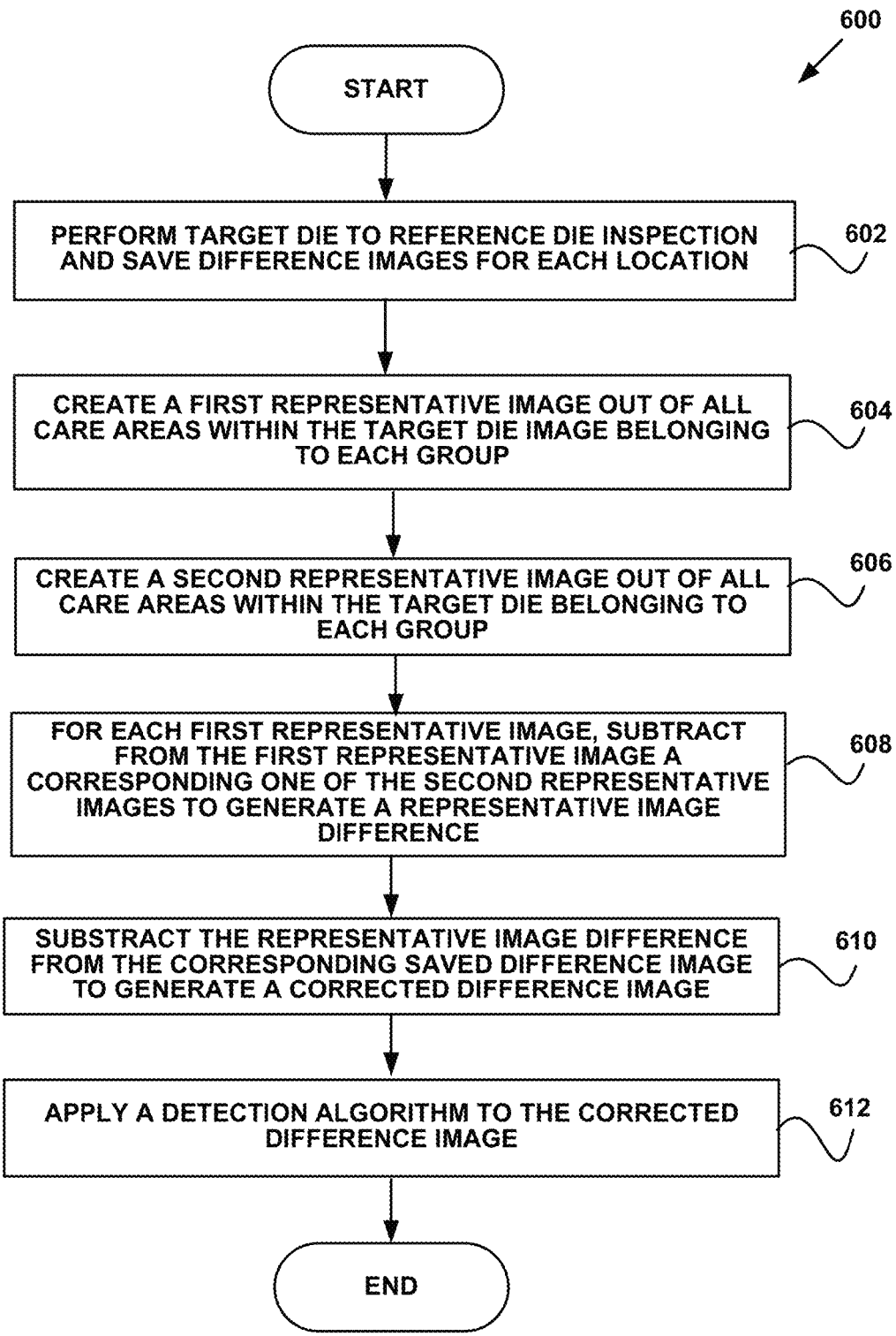
FIG. 6 illustrates a method for using setup data to correct a difference image generated from a comparison of target and reference dies, in accordance with an embodiment.

FIG. 6 illustrates a method 600 for using setup data to correct a difference image generated from a comparison of target and reference dies, in accordance with an embodiment. The setup data is that generated using the method 500 of FIG. 5. Also, the method 600 may be carried out in the context of the environments described above with respect to FIGS. 3A and/or 3B. For example, the method 600 may be carried out by the inspection system 305 of FIG. 3B. The above description and definitions may also equally apply to the present description.

As shown in operation 602, a target die to reference die inspection is performed and difference images for each location are saved. This inspection may involve comparing a target die image and reference die image and generated a difference image for each corresponding location between the target die image/reference die image that differ.

In operation 604, a first representative image is generated out of all care areas within the target die image belonging to each group. Thus, for each pattern of interest, a first representative image may be generated for the target die. In operation 606, a second representative image is generated out of all care areas within the reference die image belonging to each group. In this case, for each pattern of interest, a second representative image may be generated for the reference die.

Further, as shown in operation 608, for each first representative image, a corresponding one of the second representative images is subtracted from the first representative image to generate a representative image difference. Thus, each representative image difference may be a difference between a first representative image and a second representative image for a same pattern of interest.

The representative image difference is then subtracted from the corresponding saved difference image to generate a corrected difference image, as shown in operation 610. This may be repeated for to correct each difference image. The corrected difference image may have reduced noise compared to the difference image generated from the comparison of the target die image and the reference die image. For example, the correction may result in the critical dimension variation and color variation being removed from the corrected difference image. The signal and thresholding may then be modulation-independent.

Still yet, a detection algorithm is applied to the corrected difference image, as shown in operation 612. The detection algorithm may be applied to the corrected difference image to detect defects in the target die image. For example, defect attributes may be calculated using the corrected difference image, such as magnitude, energy, and peakedness, and these attributes may be used to find outlier sites and to identify likely failures in the target die.

Applying the above described methods on PWQ and FEM wafers is likely to provide (a) increased sensitivity, (b) much more straightforward tuning, (c) ability to perform PWQ scans in one test and thus significantly increase the throughput of PWQ inspections.

Further, these methods may suppress the effect of global critical dimension variations and color variation that dominate the signal especially on PWQ wafers, but to a smaller extent on FEM wafers and evern non-modulated wafers. The more complete subtraction of global critical dimension variations allows more accurate calculation of defect attributes that capture the local nature of systematic failures on PWQ wafers. Additionally, in comparison to just an intra-die inspection, these methods allows combining images from the entire die across swaths, because the correction removes the sensor calibration issues and other in-die systematic noise.

These above described methods may also be used for hot spot discovery (i.e. first pass PWQ inspection). In this embodiment, a regular hot inspection would have to be produced, design based group (DBG) would have to be performed on two scales (scale of the hot spot, and the scale of the larger context). The post-processing of the hot spot groups could then follow the methods described above. In addition, exposing the corrected difference image in an optics selector along with noise statistics may be used for mode selection.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
performing an intra-die inspection of a target die image to generate, for each pattern of interest, a first representative image;
performing an intra-die inspection of a reference die image to generate, for each of the patterns of interest, a second representative image;
comparing the target die image and the reference die image to generate at least one difference image;
correcting the at least one difference image using each of the generated first representative images and each of the generated second representative images; and
performing detection using the corrected difference image.

2. The method of claim 1, further comprising receiving the target die image and the reference die image from a collector of an inspection system.

3. The method of claim 1, wherein at least one of the target die and the reference die are modulated.

4. The method of claim 1, wherein performing the intra-die inspection of the target die image to generate, for each pattern of interest, the first representative image includes:
identifying a pattern of interest within the target die image,
identifying all instances of the pattern of interest within the target die image,
creating care areas for the instances,
grouping the care areas,
collecting a signal from each of the care areas,
aggregating the signals to generate the first representative image for the pattern of interest.

5. The method of claim 4, wherein aggregating the signals includes determining a pixel-by-pixel mean from the signals.

6. The method of claim 4, wherein aggregating the signals includes determining a pixel-by-pixel median from the signals.

7. The method of claim 1, wherein performing the intra-die inspection of the reference die image to generate, for each of the patterns of interest, the second representative image includes:
identifying one of the patterns of interest associated with the target die image,
identifying all instances of the pattern of interest within the reference die image,
creating care areas for the instances,
grouping the care areas,
collecting a signal from each of the care areas,
aggregating the signals to generate the second representative image for the pattern of interest.

8. The method of claim 1, wherein each of the at least one difference image indicates a corresponding location in the target die image and the reference die image having a different signal.

9. The method of claim 8, wherein the at least one difference image is generated without use of a sensitivity threshold.

10. The method of claim 1, wherein correcting the at least one difference image using each of the generated first representative images and each of the generated second representative images includes, for each of the patterns of interest:

obtaining a representative difference between the first representative image generated for the pattern of interest and the second representative image generated for the pattern of interest, and
subtracting the representative difference from each of the at least one difference image associated with a location having the pattern of interest.

11. The method of claim 1, wherein performing the detection using the at least one corrected difference image includes applying a detection algorithm to the at least one corrected difference image to detect defects in the target die image.

12. The method of claim 1, wherein the at least one corrected difference image has reduced noise compared to the at least one difference image generated from the comparison of the target die image and the reference die image.

13. A computer program product embodied on a non-transitory computer readable medium, the computer program product including code adapted to be executed by a processor to perform a method comprising:
performing an intra-die inspection of a target die image to generate, for each pattern of interest, a first representative image;
performing an intra-die inspection of a reference die image to generate, for each of the patterns of interest, a second representative image;
comparing the target die image and the reference die image to generate at least one difference image;
correcting the at least one difference image using each of the generated first representative images and each of the generated second representative images; and
performing detection using the corrected difference image.

14. The computer program product of claim 13, wherein performing the intra-die inspection of the target die image to generate, for each pattern of interest, the first representative image includes:
identifying a pattern of interest within the target die image,
identifying all instances of the pattern of interest within the target die image,
creating care areas for the instances,
grouping the care areas,
collecting a signal from each of the care areas,
aggregating the signals to generate the first representative image for the pattern of interest.

15. The computer program product of claim 13, wherein performing the intra-die inspection of the reference die image to generate, for each of the patterns of interest, the second representative image includes:
identifying one of the patterns of interest associated with the target die image,
identifying all instances of the pattern of interest within the reference die image,
creating care areas for the instances,
grouping the care areas,
collecting a signal from each of the care areas,
aggregating the signals to generate the second representative image for the pattern of interest.

16. The computer program product of claim 13, wherein correcting the at least one difference image using each of the generated first representative images and each of the generated second representative images includes, for each of the patterns of interest:

obtaining a representative difference between the first representative image generated for the pattern of interest and the second representative image generated for the pattern of interest, and subtracting the representative difference from each of the at least one difference image associated with a location having the pattern of interest.

17. An inspection system, comprising:

at least one processor for:

performing an intra-die inspection of a target die image to generate, for each pattern of interest, a first representative image;

performing an intra-die inspection of a reference die image to generate, for each of the patterns of interest, a second representative image;

comparing the target die image and the reference die image to generate at least one difference image;

correcting the at least one difference image using each of the generated first representative images and each of the generated second representative images; and performing detection using the corrected difference image.

18. The inspection system of claim 17, wherein performing the intra-die inspection of the target die image to generate, for each pattern of interest, the first representative image includes:

identifying a pattern of interest within the target die image, identifying all instances of the pattern of interest within the target die image, creating care areas for the instances, grouping the care areas, collecting a signal from each of the care areas, aggregating the signals to generate the first representative image for the pattern of interest.

19. The inspection system of claim 17, wherein performing the intra-die inspection of the reference die image to generate, for each of the patterns of interest, the second representative image includes:

identifying one of the patterns of interest associated with the target die image, identifying all instances of the pattern of interest within the reference die image, creating care areas for the instances, grouping the care areas, collecting a signal from each of the care areas, aggregating the signals to generate the second representative image for the pattern of interest.

20. The inspection system of claim 17, wherein correcting the at least one difference image using each of the generated first representative images and each of the generated second representative images includes, for each of the patterns of interest:

obtaining a representative difference between the first representative image generated for the pattern of interest and the second representative image generated for the pattern of interest, and subtracting the representative difference from each of the at least one difference image associated with a location having the pattern of interest.

* * * * *